(12) United States Patent
Templin et al.

(10) Patent No.: US 11,822,104 B2
(45) Date of Patent: Nov. 21, 2023

(54) REFLECTIVE COMPOSITE MATERIAL HAVING A VARNISHED ALUMINUM CARRIER HAVING A SILVER REFLECTION LAYER AND METHOD FOR PRODUCTION THEREOF

(71) Applicant: ALANOD GMBH & CO. KG, Ennepetal (DE)

(72) Inventors: Frank Templin, Herdecke (DE); Stefan Ziegler, Sprockhövel (DE); Carmen Wülfing, Wuppertal (DE); Thorsten Göschel, Recklinghausen (DE); Renè Püschl, Schermbeck (DE); Alexander Peetsch, Gevelsberg (DE); Tobias Titz, Haan (DE)

(73) Assignee: ALANOD GMBH & CO. KG, Ennepetal (DE)

( * ) Notice: Subject to any disclaimer, the term of this patent is extended or adjusted under 35 U.S.C. 154(b) by 703 days.

(21) Appl. No.: 15/754,389

(22) PCT Filed: Aug. 24, 2016

(86) PCT No.: PCT/EP2016/069999
§ 371 (c)(1),
(2) Date: Feb. 22, 2018

(87) PCT Pub. No.: WO2017/032809
PCT Pub. Date: Mar. 2, 2017

(65) Prior Publication Data
US 2018/0239067 A1    Aug. 23, 2018

(30) Foreign Application Priority Data
Aug. 25, 2015    (DE) ..................... 10 2015 114 094.2

(51) Int. Cl.
*G02B 5/08*    (2006.01)
*C09D 4/00*    (2006.01)
(Continued)

(52) U.S. Cl.
CPC ............. *G02B 5/0875* (2013.01); *C09D 1/00* (2013.01); *C09D 4/00* (2013.01); *C09D 5/004* (2013.01);
(Continued)

(58) Field of Classification Search
CPC ... G02B 1/10; G02B 1/14; G02B 5/08; G02B 5/0808; G02B 5/0858; G02B 5/0875; G02B 5/0866; C25D 11/18; C25D 11/246
See application file for complete search history.

(56) References Cited

U.S. PATENT DOCUMENTS 3,601,471 A    8/1971   Seddon
4,113,895 A *  9/1978   Watt ..................... C09D 11/101
                                                           427/410

(Continued)

FOREIGN PATENT DOCUMENTS

DE    102006030094 A1    8/2007
DE    202011050976 U1    11/2012
(Continued)

OTHER PUBLICATIONS

Machine Translation of WO2014208255A1 (Year: 2014).*
(Continued)

*Primary Examiner* — Monique R Jackson
(74) *Attorney, Agent, or Firm* — Dickinson Wright PLLC

(57) ABSTRACT

The invention relates to a reflective composite material (V) having a carrier (1) consisting of aluminum, having an interlayer (2) which is present on a side (A) on the carrier (1) and is composed of a varnish, and having an optically active multilayer system (3) which has been applied atop the (Continued)

interlayer (2) and consists of at least three layers, wherein the upper layers (4, 5) are dielectric and/or oxidic layers, and the lowermost layer (6) is a metallic layer which consists of silver and forms a reflection layer (6). To increase the aging resistance, it is proposed that the interlayer (2) comprise an organic layer-forming varnish or be formed entirely from such a varnish that has been cured in an ionic photopolymerization and crosslinking or that has been cured after UV irradiation by free-radical photopolymerization and crosslinking.

26 Claims, 1 Drawing Sheet

(51) Int. Cl.
  *C09D 5/33* (2006.01)
  *C09D 163/00* (2006.01)
  *C09D 1/00* (2006.01)

(52) U.S. Cl.
  CPC ......... *C09D 163/00* (2013.01); *G02B 5/0808* (2013.01); *G02B 5/0858* (2013.01)

(56) References Cited

U.S. PATENT DOCUMENTS

| | | | |
|---|---|---|---|
| 6,078,425 A | 6/2000 | Wolfe et al. | |
| 6,310,737 B1* | 10/2001 | Gillich | G02B 1/14 359/884 |
| 6,627,307 B1 | 9/2003 | Reichert et al. | |
| 6,848,797 B1 | 2/2005 | Gillich et al. | |
| RE39,790 E * | 8/2007 | Fuchs | C25D 11/18 428/336 |
| 8,915,244 B2 | 12/2014 | Von Behrens | |
| 2001/0038894 A1* | 11/2001 | Komada | C23C 14/562 428/34.6 |
| 2003/0048554 A1* | 3/2003 | Gillich | G02B 1/14 359/870 |
| 2003/0176519 A1 | 9/2003 | Crivello | |
| 2005/0064333 A1 | 3/2005 | Crivello | |
| 2008/0038485 A1* | 2/2008 | Fukazawa | C23C 16/30 427/585 |
| 2012/0300291 A1 | 11/2012 | Abbott | |
| 2013/0033773 A1* | 2/2013 | Templin | G02B 1/105 359/838 |
| 2013/0342900 A1* | 12/2013 | Koeckert | G02B 5/0875 359/359 |
| 2015/0138782 A1 | 5/2015 | Cai et al. | |

FOREIGN PATENT DOCUMENTS

| | | |
|---|---|---|
| DE | 10 2012 108 719 A1 | 3/2014 |
| EP | 2 253 737 A1 | 11/2010 |
| EP | 2 584 384 A1 | 4/2013 |
| WO | WO 1999/026088 A1 | 5/1999 |
| WO | WO 2000/029784 A1 | 5/2000 |
| WO | WO 2012/059527 A2 | 5/2012 |
| WO | WO 2014/208255 A1 | 12/2014 |

OTHER PUBLICATIONS

Machine translation of DE102006030094A1 published Aug. 2007. (Year: 2007).*
Dobrowolski, Optical Properties of Films and Coatings, 1995, Chapter 42 in Handbook of Optics, Fundamentals, Techniques, & Design, Second Edition, vol. I, Michael Bass (Ed.), pp. 42.3-42.19, 42.34-42.54, 42.94-42.98, 42.101-108. (Year: 1995).*
International Search Report of PCT/EP2016/069999 dated Nov. 14, 2016.

* cited by examiner

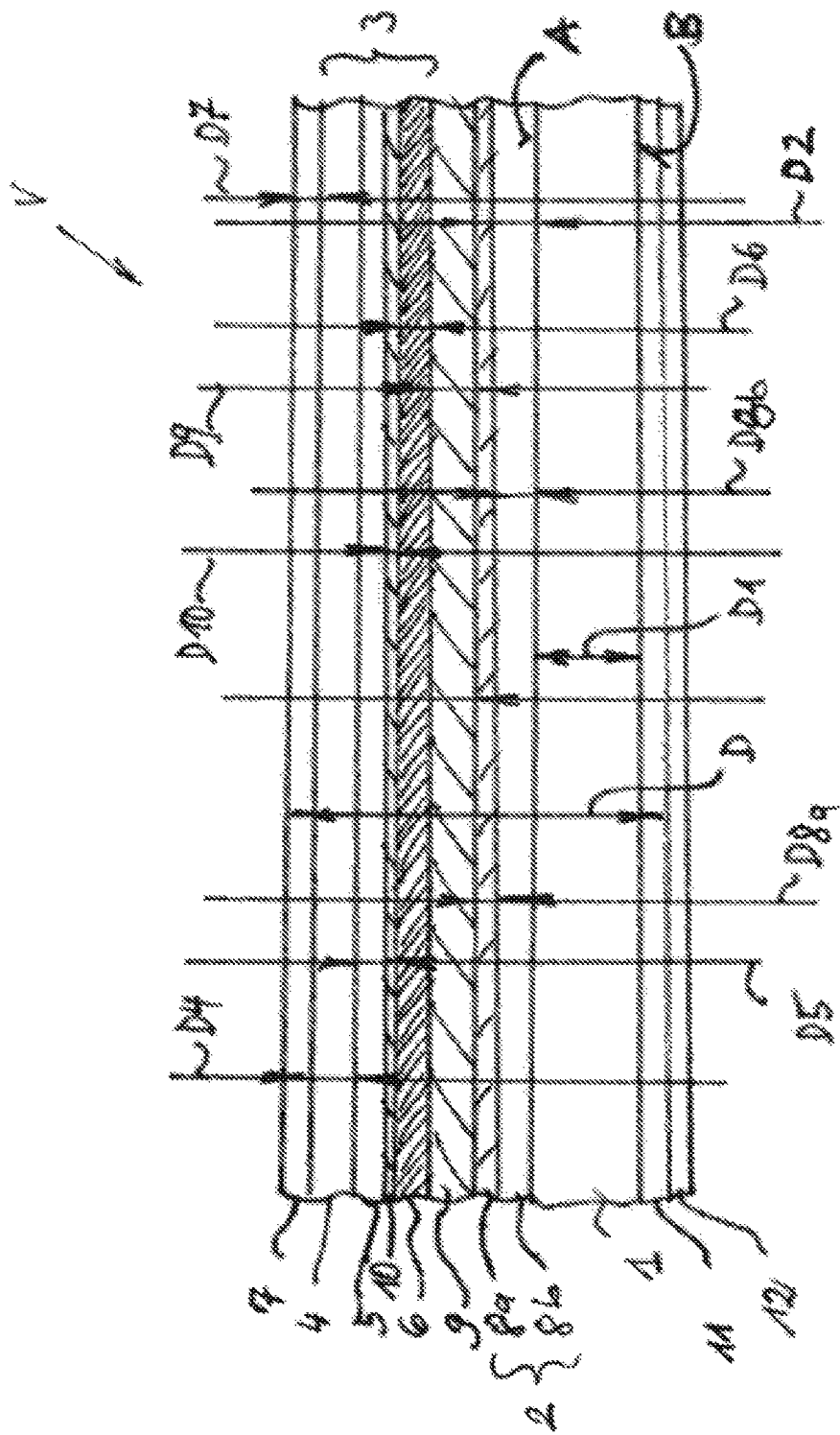

REFLECTIVE COMPOSITE MATERIAL HAVING A VARNISHED ALUMINUM CARRIER HAVING A SILVER REFLECTION LAYER AND METHOD FOR PRODUCTION THEREOF

CROSS-REFERENCE TO RELATED APPLICATIONS

This application is a 35 U.S.C. § 371 national phase application of PCT International Application No. PCT/EP2016/069999, filed Aug. 24, 2016, which claims the benefit of priority under 35 U.S.C. § 119 to German Patent Application No. 10 2015 114 094.2, filed Aug. 25, 2015, the contents of which are incorporated herein by reference in their entirety.

FIELD OF INVENTION

The present invention pertains to a reflective composite material with a substrate consisting of aluminum, with an intermediate layer made of a lacquer located on one side on the substrate, and with an optically active multi-layer system applied above the intermediate layer; the multi-layer system consisting of at least three layers, wherein the upper layers are dielectric and/or oxidic layers, and the lower layer is a metallic layer consisting of silver, which forms a reflective layer. In addition, the present invention pertains to a method for production of one such reflective composite material.

BACKGROUND

A composite material similar to that briefly described above has a surface-enhanced aluminum band and is known under the name of MIRO®-Silver; it is widely used for lighting equipment, daylight systems and decorative applications. The surface treatment herein is used to better protect the sensitive aluminum surface and to increase the light reflectivity. The surface enhancement process consists of two different processes, both of which can be operated continuously, and specifically consists of the production of the intermediate layer; however in contrast to the application of a lacquer; in a wet-chemical process, which is known generically as anodizing, employs an electrolytic luster process and also an anodic oxidation, and of the application of the optically active multi-layer optical system in a vacuum.

Furthermore, as the substrate material for reflectors with a high total reflectivity, rolled aluminum with a minimum purity of 97% is used, and since crude aluminum has a sensitive surface, the intermediate layer has to be applied so as to protect against mechanical and chemical factors in order to attain the useful properties. This protective intermediate layer for the MIRO® material is produced in the wet-chemical anodizing process, wherein the result attained is that the surface features a sufficiently low roughness and a sufficient hardness and also a defect-free formation. Due to a change in the purity and/or the roughness, the level of total reflection can be varied, whereas by specific changes to the rolled structure of the aluminum substrate, the degree of diffuse reflection can also be varied. A highly reflective purest silver layer is deposited onto the anodized layer. This silver layer is optically dense and features an extremely high total reflection in the range of visible light.

The at least two layers of the multi-layer optical system located on the silver layer are generally dielectric layers, wherein the use of oxidic layers, such as titanium oxide, for example, as highly refractive top layer and silicon dioxide or aluminum oxide as the lower refractive layer underneath and deposited onto the silver layer, represents a special, preferred case. Details are found, for example, in the description of the known MIRO® process, which however, does use aluminum as metallic reflective layer, see "elektrowärme international" 53 (1995) B 4; November, p. B215-B223.

In general, when radiation strikes an object, the radiation is split into a reflected, an absorbed and a transmitted part, which are determined by the reflectivity (reflective capacity), the absorptivity (absorption capacity), and the transmissivity (transmission capacity) of the object. Reflective capacity, absorption capacity and transmission capacity are optical properties which can take on different values for one and the same material, depending on the wavelength of the incident radiation (e.g. in the ultraviolet range, in the range of visible light, in the infrared range and in the range of thermal radiation). With respect to the absorptive capacity, the known Kirchhoff law describes how the degree of absorption is in a constant ratio to the degree of emission at a particular temperature and wavelength. Thus, for the absorption capacity, the Wien's displacement law or Planck's law, and also the Stefan Boltzmann law, are relevant; they describe the particular relationships between radiation intensity, spectral distribution density, wavelength and temperature for a so-called "black body." In this regard it must be taken into account in any calculations that the "black body" does not exist per se, and every real material will deviate in some characteristic manner from the ideal distribution.

In the known composite material, the high reflective capacity in the range of visible light plays a particularly important role, which is expressed for example, in a total light reflectivity with peak values of up to more than 98 percent determined according to DIN 5036, Part 3. In addition, for the known material, which is supplied preferably as a semi-finished product, its outstanding processability, in particular its deformability, must be emphasized. However, the problem with Miro®-Silver material, especially in long-term applications and when used in a hot environment, such as in hot climates or together with a luminant which features a powerful heat radiation, is that there can be a faster loss of reflective capacity than with the Miro®-material, which has been known for some time, and whose reflective metallic layer consists of aluminum. Due to the cited material differences, the reason for this phenomenon is considered as being a corrosion of the silver associated with diffusion processes. It is to be assumed here that an electrochemical difference in potential between the non-noble aluminum substrate and the silver reflective layer, which as a noble metal exhibits a greater standard potential in the electrochemical series, can be seen as promoting the diffusion.

From WO 00/29784 A1 a composite material of the kind specified above is known. The emphasis of this application is on a protective layer located on the surface of the optically active system. According to WO 00/29784 A1, the reflective layer system, which is designated as a functional coating, is a reflecting layer, such as a layer containing aluminum, silver, copper, gold, chromium, nickel or their alloys. In this regard no distinction is made between the properties of the individual materials of the layer and/or between their advantages and disadvantages. At least one pretreatment layer can be disposed between the reflector body and the functional coating; in the case of a reflector body made of a predominately iron-containing metal, this pretreatment layer can be a layer produced by phosphating, chromating or by zincplating. In the case of a reflector body made of aluminum, the pretreatment layer can be, for example, a layer likewise produced by chromating, phosphating or by anodic oxidation. Preferably the pretreatment layer consists of anodic oxidized aluminum and is produced, in particular, directly from the aluminum resting on the surface of the reflector body. In addition or as an alternative thereto, a sol-gel or lacquer layer consisting of silanes can be applied onto the reflector body directly or via a pretreatment layer. In contrast to the organic alkanes, which consist of a basic carbon structure and hydrogen, the designation of silanes here stands for a group of chemical compounds which consists of an inorganic silicon base structure and hydrogen. The production of a low-porous silane layer is difficult and/or at least can only be achieved with greater technological effort. In the case of a metallic reflective layer of silver, therefore, owing to the corrosion of the silver associated with the diffusion, a loss of reflective capacity must be expected, as was already described above for the material Miro® Silver.

Furthermore, from WO 99/26088 A1, a composite material is known for reflectors with a band-shaped metallic substrate, an intermediate layer and with a multi-layer optical system applied upon the intermediate layer, in which the intermediate layer can consist of a lacquer which is a polycondensate produced on the basis of one or a plurality of monomers, a poly-adduct or a polymerizate produced in particular by a radical polymerization. As the bottom layer of the optically active multi-layer system, a metallic layer consisting in particular of aluminum is applied onto the intermediate layer. Silver is not named as a constituent of this layer in the WO 99/26088 A1 application. Nor is the problem of a diffusion occurring from the reflective layer addressed.

The primary object of the present invention is to create a composite material of the kind described above, produced with comparatively less technological effort, which has high reflectivity and is thus particularly suitable for reflective systems; which features long-term, reduced loss of total light reflectivity, especially at temperatures greater than room temperature (20° C.); and which has a surface that is highly resistant to mechanical stress i.e. is particularly abrasion-resistant. Furthermore, the invention should disclose a corresponding production method.

This problem is solved for the composite material according to the invention in that the intermediate layer (2) having an organic, layer-forming lacquer, or is formed completely of one such lacquer, which hardens due to an ionic, photo-polymerization and crosslinking.

With regard to the method, this problem is solved according to the invention in that the intermediate layer; at least with one upper, partial layer is formed by application of an organic lacquer, which after application hardens by means of an ionic photo-polymerization and crosslinking.

Due to the intermediate layer according to the invention, which is produced advantageously without pores, a diffusion barrier is formed by which means a migration of silver particles; in particular a migration of silver ions is assumed; in the direction toward the substrate is prevented and/or can at least can be essentially halted over the long term and also at an elevated temperature. Also, no local element acting as a corrosion-promoter can form between the silver layer and the aluminum substrate, so that the total light reflectivity remains stable in the long term. The lacquer, which can be applied by immersion, such as by an electro-immersion lacquering method, by brushing on, rolling on, centrifuging, spraying; particularly with a continuous belt cycle method; thus displays an excellent adhesion to the substrate.

With respect to the formation of the polymer from monomers, as is known, a differentiation is made; also for lacquers; according to the different reaction mechanisms corresponding to their manufacture. Every reaction mechanism thus has its own specific characteristics and leads to different product qualities. One of these reaction mechanisms is polymerization, in addition to polycondensation and poly-addition. Corresponding to the classical, narrower definition, which forms the basis of the discussion within the scope of this application, polymerization is a chemical reaction in which monomers are continuously incorporated into a growing polymer, wherein high molecular-weight chains will form. These can then be crosslinked more or less with each other to form an elastomer or a duromer. In accordance with the underlying reaction kinetics, a distinction is made between a radical polymerization and an ionic polymerization, wherein the latter, in turn, is divided into a cationic polymerization and an anionic polymerization; depending on whether positive or negative charged ions initiate the chain reaction. Furthermore, a coordination chain polymerization is known. In addition to these known basic forms, dual systems also are used in which different reaction mechanisms can proceed side by side.

The invention provides for an ionic, preferably a cationic, polymerization, which compared to a radical polymerization, as mentioned in WO 99/26088 A1, has the advantage with regard to the problem to be solved in that here no termination reaction occurs as it does in radical polymerization. In this respect, the term used is a so-called "living polymerization." Under the "live conditions" in which the growing chains are ions, it is possible, in an advantageous manner, to adjust the molecular weight within a narrow distribution. Also, under these conditions, clearly-defined polymer structures with favorable application properties can be produced, such as block copolymers with specific sequence lengths, for example. A low volume contraction of the lacquer during polymerization and a comparatively greater adhesion to the substrate represent further advantages of ionic hardening systems in comparison to radical polymerization.

According to the invention, we are dealing simultaneously with a photo-polymerization, that is with an ionic polymerization initiated by photo-chemical excitation. In this case, radiation energy which is determined by the wavelength of the employed radiation, activates a photo-initiator or starter in the lacquer, which sets off the polymerization, so that the monomer then converts the organic phase into a polymer. The initiator generates the ions which results in the polymerization. For hardening; which is associated with crosslinking; UV, IR, electrons and/or laser radiation can be used, as well as light from LED sources, and the hardening can also be carried out at a temperature elevated above room temperature. However, hardening at room temperature is more advantageous because it is more energy-economical.

One advantage of photo-polymerization; with a comparatively less complicated process control in terms of technology or apparatus; is a higher attainable degree of polymerization, with no monomer remaining in the intermediate layer, which produces inter alia a high abrasion stability. With targeted use of radiation, the hardening can be controlled, and advantageously, a fast fixing, a hardening without application of heat, short reaction times until initial hardening, the use of single-component systems and a UV hardening are all possible.

In connection with the importance of photo-polymerization per se, as explained above, it should be emphasized that the problem underlying the invention is also, alternatively, solved according to the invention for the composite material in that the intermediate layer includes an organic, layer-forming lacquer or is formed completely of a lacquer of this kind, which is hardened after UV irradiation by means of a radical photo-polymerization and crosslinking.

Accordingly, for the method, this problem is alternatively solved according to the invention in that the intermediate layer, at least with an upper partial layer, is formed by application of an organic lacquer which is hardened after coating, with the use of UV light, by employing a radical photo-polymerization and crosslinking.

With regard to the chemistry of this alternative embodiment of the invention, a highly reactive, photo-polymerizable, solvent-containing, acrylate-containing lacquer system, preferably a single component acrylate system, can be used here, the solvent being in particular an alcoholic one. The particular characteristics of this kind of lacquer can be that it is colorless, transparent, and crystal-clear; that it can be applied in very thin layers; and that it, due to a very low viscosity (viscosity: 2.3 mPas and/or 11+1 s measured with the 4 mm flow cup according to DIN 53211) can enter the pores of a compressed or non-compressed anodized partial layer potentially lying underneath it.

The pores of these kinds of anodized layers exhibit typical diameters, depending on their design, in the range of 5 nm to 150 nm. The UV lacquers used according to this invention can penetrate into these pores and can thus enable good adhesion after drying.

Also the alternative lacquer according to the invention, in particular the solvent-containing, single-component acrylate system named above, produces a high UV long-term stability which is expressed in particular in its survival of the 1008 h QUV load test specified in more detail below. The specific advantages of the UV-hardened lacquer according to this invention are found in its interaction with a silver layer in the optical multi-layer system, in particular in connection with the system MIRO®-Silver, it can be noted that it crosslinks more strongly than a conventional lacquer of comparable layer thickness, wherein nonetheless, due to smoothing, a very low surface roughness is achieved, and wherein both the wipe resistance and also the corrosion resistance and barrier effect are greater, in comparison to a conventionally hardened lacquer.

In particular, in the alternative method according to the invention, formation of a film and hardening by a radical polymerization brought about preferably by the use of mercury medium-pressure lamps can be obtained at an energy dosage in the range of 1 $J/cm^2$ to 3 $J/cm^2$, wherein in particular a complete hardening of the lacquer occurs after one week.

By a suitable selection of the mixture and/or of the method of application and/or of the hardening parameters, a nearly complete smoothing of the substrate surface can be adjusted, so that a smooth surface is produced with minimum rough depth, or if desired, with a specific corrugation or roughness structure. Thus the lacquer will be equally important, with regard to its effect on the reflection, as the roller surfaces of the known aluminum bands. Another important advantage of the invention is thus the possibility to use a low-cost metallic substrate which can consist of simple, technical rolled aluminum. The surface roughness present on this material no longer plays a role, since the surface structure of the composite material according to the invention is determined primarily by the intermediate layer. Thus the substrate can have any particular topography and a surface roughness (average arithmetic roughness value Ra) in the range of e.g. 0.01 µm to 5 µm, more preferably in the range of 0.01 µm to 0.5 µm. The meaning of surface roughness is evident here from at least one of the presently applicable DIN-Regulations 4761 to 4768. The thickness of the intermediate layer can be advantageously adapted to the roughness of the substrate material, wherein in particular a thickness of the lacquer; understood to be the maximum value of the dry layer thickness after lacquer hardening; in the range of 1 µm to 15 µm is deemed to be the optimum. The actual thickness of the lacquer in an optimum implementation can be less, and preferably in a range from 0.1 µm to 5 µm, more preferably in a range from 0.3 µm to 1 µm. Due to the good lacquer profile, which has a smoothing effect, an average arithmetic roughness value Ra in the range of less than 0.02 µm, in particular of less than 0.01 µm, can be easily adjusted on the surface of the intermediate layer. In the composite material this leads to a high, directed reflection.

In an advantageous manner the entire production process of the composite material according to the invention can take place in a continuous process. The optical multi-layer system and the protective layer can be applied to the intermediate layer in a continuous, vacuum-band coating process, wherein also the lacquer in the intermediate layer can be applied with a band or pass-through method, also called coil-coating method, and crosslinked. The lacquer layers formed are distinguished by a high scratch-resistance, ductility and insensitivity to corrosive factors. With regard to a vacuum coating that takes place after application of the intermediate layer, it is an advantage to use a lacquer that features a degassing rate after hardening of less than $10^{-4}$ mbar*l s l $m^2$.

The intermediate layer can be produced preferably by cationic photo-polymerization of the lacquer employed for forming of the layer; under the action of UV radiation as already mentioned; and then hardening of the lacquer. Another important advantage of cationic hardening is its insensitivity to oxygen, so that high reaction speeds are possible under standard air conditions. Moisture and alkaline factors, however, should be avoided.

In one preferred embodiment of the invention, the lacquer of the intermediate layer can be an epoxy resin; particularly preferred is a cyclo-aliphatic epoxy resin, wherein a resin of this kind should be a polyether with generally and preferably two terminal-positioned epoxy groups.

The epoxy group; also called an epoxide group, epoxy ring or oxirane group; is a cyclical, organic-chemistry atom grouping of two carbon atoms and one oxygen atom (epoxy bridge), which form what is known as a three-ring structure in the form of acyclic ether. The epoxy group is protonated during the cationic polymerization, which is the prerequisite for the forming of a duroplastic material from the lacquer due to chain growth and preferably by crosslinking; the duroplastic has high mechanical, temperature and chemical resistance.

The epoxy group is a functional group which is viewed as being very highly reactive, which can mean in particular that its ring structure will open under proton donation. This occurs for example, due to an occurring photolysis of iodonium salts, in particular of diaryl iodonium salts, such as bis(dodecyl phenyl)-iodonium hexafluoro-antimonate, bis-(4-methyl-phenyl)-iodonium hexafluoro-phosphate, bis-((C10-C14)-alkylphenyl)-iodonium hexafluoro-antimonate or bis-(4,4-dodecyl-phenyl)-iodonium hexafluoro-phosphate, which causes the generation of strong protonic acids. The acid proton opens the epoxide ring and starts the chain growth. Once the reaction is underway, it can proceed in the dark without additional exposure to radiation. This "living polymerization"; as mentioned before; can be further improved by a heat treatment, and causes an after-hardening which provides advantages in the low-irradiated and shaded regions. To improve the activity of the iodonium salts, sensitizers such as thioxanthone-derivates, can be used, for example. Also, sulfonium salts can be used favorably as photo initiators.

In summary, the advantages of these kinds of photo-initiated, cationic polymerized epoxy resins that should be stressed are their good resistance to environmental factors and various media, their high temperature stability due to the high glass transition temperature and the absence of a softening, as occurs with thermomers; after hardening their dry and non-adhesive surface which is intended for application of the optically active multi-layer optical system; their low shrinkage (of less than 2 to 3 percent) during polymerization and crosslinking, their extreme ion purity with alkali and halide contents that can lie under 10 ppm, as well as their variably adjustable mechanical material properties; from flexible and soft with high elongations at break to hard and scratch resistant.

Similar advantages can also be confirmed for the possible use of oxetanes in the lacquer according to this invention, which pertain to organic compounds which display a heterocyclic four-ring structure with one oxygen atom in the ring, thus also being counted among the cyclic ethers. Also the use of epoxided linseed oil (ELO) and vinyl ether in the lacquer appears possible.

One special property of the preferred, solvent-free polyether lacquers is their; with simple application; short hardening time, wherein a distinction can be made here between initial hardening up to what is called hand-tack and then continuing on to what is called the final strength. The hand-tack, which is characterized by the onset of a no-longer tacky surface, can be attained after only 100 s to 300 s, whereas it can take up to 25 hours to 150 hours to obtain the final strength; preferably without the application of additional energy.

Coating with the optically active multi-layer system should take place in particular in the post-hardening period, that is, in the time between the onset of the hand-tack stage and the attainment of the final strength, since during the post-crosslinking; which is not entirely completed during this time; the formation of a high adhesion strength is promoted between the lacquer of the intermediate layer and the silver reflection layer located above it, and/or with an optionally present adhesion-promoting layer consisting, for example of $TiO_2$. By means of experiments it was found that a resting period in the range of 15 to 50 hours, in particular from 22 to 26 hours, between the lacquering and the application of the optically active multi-layer system was the optimum.

According to Fick's first law, during a diffusion, the particle flow density (flow) J (mol m$^{-2}$ s$^{-1}$) is proportional to the concentration gradient (force) ∂c/∂x (mol m$^{-4}$) opposite the direction of diffusion.

$$J = -D \frac{\partial c}{\partial x}$$

The proportionality constant is the coefficient of diffusion D (m$^2$ s$^{-1}$). Therefore, the coefficient of diffusion D is a measure of the mobility of the particles and can be determined from the average square of the path traversed per time unit. Voids are required between different free spaces for diffusion in solid bodies. The particles in this case must overcome an energy barrier E, which is easier to accomplish at elevated temperature than at lower temperature. This is described by the relationship:

$$D = D_0 \cdot \exp\left(-\frac{E}{R \cdot T}\right)$$

with
E=energy barrier (in J mol$^{-1}$)
R=general gas constant (in J K$^{-1}$ mol$^{-1}$)
T=temperature (in K)

Due to the intermediate layer according to the invention, the coefficient of diffusion D of the silver is reduced in comparison to anodized layers, conventional non-specified lacquers and to intermediate layers based on silanes. The reduction of the coefficient of diffusion D in this case is attributable to the fact that the energy barrier E, which the silver particles in the intermediate layer must overcome in order to change between different free spaces; in the present case formed by the preferably duromer lacquer matrix; is greater than the energy barrier E in a sol-gel layer, an anodic oxidized layer or another, conventional, non-specified lacquer. Particle migration downward; toward the substrate; is thus inhibited within the meaning of the first diffusion law. Taking into account the relationship stated above, which is expressed by a decrease in the total light reflection, any ageing that takes place particularly at a temperature elevated in comparison to room temperature, is thereby extremely retarded in an advantageous manner.

Then, as an option, an anodic oxidized layer can be provided on the substrate; as is the case for Miro®-Silver; so that the intermediate layer is formed from two partial layers, of which at least the upper, partial layer is formed according to the invention. The anodic oxidized partial layer; even if it does not rest upon the surface; together with the lacquer layer, and with an optionally present adhesion-promoting layer on the intermediate layer to increase the adhesion of the silver, and also together with the optical multi-layer system; can be of significant importance for adjusting a high scratch or wipe resistance, and also for the corrosion resistance of the composite material according to this invention.

Due to the aluminum substrate; possibly also for the anodized layer whose thickness can preferably be in the range of 0.01 μm to 10.0 μm, more preferably in the range of 0.5 μm to 2.0 μm, and particularly preferably in the range of 0.7 μm to 1.5 μm; an outstanding ductility can be ensured, so that the composite material according to the invention can withstand stresses occurring in any subsequent shaping processes with no trouble. Further advantages to be emphasized are the high thermal conductance of the substrate and the ability to obtain a surface structure which promotes reflection in the solar wavelength range, and/or the ability to obtain a variable surface structure for fractions of diffuse and directed reflection, and then the other layers will follow in relief.

The composite material according to the invention can be produced as a coil; in particular with a width of up to 1400 mm, preferably up to 1600 mm. A reflector material of this kind made of aluminum band according to the invention is deformable, without the optical, mechanical and chemical properties of the material being adversely impacted.

In order to improve the adhesion during production of the composite material to the lacquer of the silver layer that is to be deposited onto the intermediate layer, it can be expedient to provide an adhesion-promoting layer. In this case, oxidic adhesion promoters, such as preferably $Al_2O_3$, $TiO_2$ or $CrO_s$ are particularly suitable, since they display a low reactivity with the silver, and wherein s denotes a stoichiometric of non-stoichiometric relationship. The layer thickness of the adhesion-promoting layer in this case can be in a range from 1 nm to 50 nm, preferably in the range from 5 nm to 25 nm, and particularly preferred in the range of 10 nm to 20 nm.

The thickness of the reflective layer can be in the range of 30 nm to 200 nm. With reference to the physical relationships stated above, this will ensure a low transmission and high reflection of the electromagnetic radiation. The silver layer can also be made from partial layers, as can all other described layers. As the preferred thickness of the silver layer, it is preferable to select a thickness in the range of 40 nm to 150 nm, and quite particularly a thickness in the range of 50 nm to 100 nm.

The adhesion-promoting layer, as well as the layers of the optical multi-layer system, can be sputter layers, produced in particular by reactive sputtering, CVD (chemical vapor deposition) or PE-CVD (plasma enhanced chemical vapor deposition) layers, or layers created by vapor deposition, in particular by means of electron bombardment or layers produced from thermal sources, so that the entire multiple-layer system located on the intermediate layer is created in an optimum manner from the processing point of view, using layers applied in a vacuum sequence, in particular in a continuous process. The named methods make it possible, in a favorable manner, to vary in a fluid manner a stoichiometric or non-stoichiometric ratio of the layer-forming elements to each other within certain limits.

In this manner, for example, the particular refractive indices of the two upper layers which cause an increase in the reflection due to their pairing can be adjusted specifically when the top layer has a higher refractive index than the layer located underneath. The material of the two layers located above the silver layer can belong to the group of metal oxides, fluorides, nitrides or sulfides, or mixtures thereof, wherein the layers display different refractive indices. For example, a difference in the refractive indices; relative to a wavelength of 550 nm; can be greater than 0.10, preferably greater than 0.20, for instance. As the materials for the top, highly refractive layer, compounds such as $Ta_2O_5$, $Nb_2O_5$, $MoO_3$, $TiO_2$ and $ZrO_2$ can be used, and materials to be used for the low-refractive index layer can be $Al_2O_3$ and $SiO_2$.

With regard to the index of the oxygen in the above-stated oxides, in particular with regard to the index "2" in the $TiO_2$, it should be noted that the oxidic layers need not necessarily be entirely stoichiometric, but rather could also be present as another oxide or suboxide, as long as they still have nearly the same high light transparency as the stoichiometrically structured oxides.

The particular optical density of the upper and of the middle layer of the optical layer system should preferably be selected; in order that the layers can act as reflection-increasing interference layers; so that it amounts to about one-quarter of the middle wavelength of the spectral range of the electromagnetic radiation to be reflected.

The upper, highly refractive dielectric layer can feature a thickness, in particular in the range of 30 nm to 200 mm, preferably of 40 nm to 100 nm, most preferably in the range of 45 nm to 65 nm.

The lower refractive, dielectric layer located underneath can feature a thickness in particular in the range of 30 nm to 200 nm, preferably in the range of 40 nm to 100 nm, and most preferably in the range of 50 nm to 70 nm.

To improve the adhesion to the silver layer and/or to prevent a delamination of the low-refractive layer from the silver layer, an additional adhesion promoting layer can be provided which likewise is in particular oxidic and can consist preferably of $CrO_s$. The second adhesion-promoting layer herein can have a thickness which resides in the same range as that of the first adhesion-promoting layer.

As an additional fourth layer, another in particular silicon oxide and/or nitride covering layer can be placed over the highly refractive upper layer of the optical multi-layer system. This fourth layer displays a high transmission capacity and improves the mechanical and corrosion resistance. An outstanding adhesion can be obtained when a dielectric layer located directly underneath the covering layer is an $Nb_2O_5$ and $Ta_2O_5$-layer applied in a PVD (physical vapor deposition) method, wherein this also promotes a good hardness and elasticity of the invented composite material. Alternatively, a titanium dioxide layer is recommended. Here, the covering layer of the optical multi-layer system can feature a minimum thickness of 3 nm, for example. At this thickness, the layer already possesses a sufficient efficiency, wherein the time, material and energy expense take on very small values. An upper limit to the layer thickness under these considerations is at about 500 nm.

Additional favorable embodiments of the invention are described in the following, detailed description.

BRIEF DESCRIPTION OF THE DRAWINGS

The invention will be explained in greater detail by means of the attached drawing which illustrates one exemplary embodiment.

The sole illustration provided, FIG. 1, shows a fundamental cross-sectional representation of a composite material according to the invention, wherein the layer thicknesses indicated therein are purely schematic and are not illustrated true to scale.

DETAILED DESCRIPTION

The described design relates to a composite material V according to the invention with a high reflectivity, in particular in the solar wavelength range. It can be used preferably for reflecting optical radiation; that is, electromagnetic radiation in the wavelength range of 100 nm up to 1 mm.

The composite material V consists of a band-like; especially a deformable; substrate 1 of aluminum, an intermediate layer 2 located on one side A of the substrate 1, and an optically active multi-layer system 3 applied onto the intermediate layer 2.

A total light reflectivity determined according to DIN 5036, part 3, amounts to more than 90% on side A of the optical multi-layer system 3, preferably at least 95%, most preferably at least 97%.

The composite material V can be produced preferably as a coil with a width up to 1600 mm, preferably of 1400 mm, and; including any possible provided layers on its reverse side B; created with a thickness D of about 0.2 mm to 1.7 mm, preferably of about 0.3 to 0.8 mm, most preferably 0.5 mm to 0.7 mm. The substrate 1 alone can have preferably a thickness D1 in the range of 0.2 mm to 0.6 mm.

The aluminum of the substrate 1 can have in particular a higher purity than 99.0%, so that its thermal conductivity is promoted. Thus the generation of thermal peaks is prevented and then the coefficient of diffusion can be kept small. For example, the substrate 1, but also the band-like aluminum sheet metal can be Al 98.3 (purity 98.3 percent) with a thickness D1 of 0.5 mm. The minimum thickness D1 of one such sheet metal can be at 100 µm, whereas the upper limit of thickness D1 can be at about 1.5 mm. It is also possible to use aluminum alloys as substrate 1, such as AlMg-alloys for example.

The intermediate layer 2 in the illustrated case consists of two partial layers 8a, 8b. The upper partial layer 8a according to the invention consists entirely of an organic, layer-forming lacquer, which is hardened by means of an ionic photo-polymerization and crosslinking, and can have a maximum thickness D8a in the range of 1 µm to 15 µm. The lower partial layer 8b is made of anodic oxidized aluminum of the substrate material, and can have a thickness D8b in the range of 10 nm to 10.0 µm, preferably in the range of 500 nm up to 2.0 µm, most preferably in the range of 700 nm to 1.5 µm. It can be prepared by wet-chemical means wherein the pores of the aluminum oxide layer in the final phase of the process chain can be mostly sealed by a hot-compression.

In this case it is preferable that the surface of the intermediate layer 2 (lacquer-partial layer 8a) has an average arithmetic roughness value $R_a$ in the range of less than 0.05 µm, in particular of less than 0.01 µm, most preferably of less than 0.005 µm. When the above-mentioned high total light reflectivity is present, this average roughness will aid in adjusting of a minimum diffuse light reflectivity defined according to DIN 5036. If a higher diffuse light reflectivity is required, then the roughness can be increased accordingly.

The optical multi-layer system 3 includes at least three layers 4, 5, 6, wherein the upper layers 4, 5 are dielectric and/or oxidic layers, and the lowest layer 6 is a metallic layer consisting of silver, which forms a reflective layer 6. The particular optical thickness D4, D5 of the upper and of the middle layers 4, 5 of the optical layer system 3 should be dimensioned; in order that the layers 4 5 can act as reflection-elevating interference layers; so that they amount to about one-fourth of the average wavelength of the spectral range of the electromagnetic radiation to be reflected. The thickness D6 of the reflection layer 6 can be preferably in the range of 40 nm to 150 nm.

In the illustrated embodiment, an optionally provided silicon oxidic covering layer 7 with a thickness D7 is applied onto the upper layer 4 of the optical multi-layer system 3. It is also possible to apply a silicon nitride or silicon oxide-nitride layer 7 onto the optical multi-layer system 3. The optical multi-layer system 3; including the covering layer 7; can be applied in a technologically favorable manner by application of a continuous vacuum band-coating process.

Likewise, the optionally provided covering layer 7 can pertain to a mixed layer having the chemical composition $Si_aC_bO_cN_dH_e$, wherein the indices a, b, c, d, e denote a stoichiometric or non-stoichiometric ratio, and are adjusted such that the covering layer 7 at a selected layer thickness D7 has only a small light absorption, in particular a light absorption of less than 10 percent, preferably of less than 5 percent, and most preferably of less than 1 percent, and wherein the carbon content; relative to the total mass of the covering layer 7; is in the range of 0 atom-percent, in particular of 0.2 atom-percent, up to 15.0 atom-percent, preferably in the range of 0.8 atom-percent to 4.0 atom-percent. For an index a=1, the other indices can be arranged in the following ranges: $0<b<2$, $0<c<2$, $0<d<4/3$, $0<e<1$. At least one of the indices b, c, d in this case should be different from zero.

A layer of this kind can be applied in particular as a CVD-layer, preferably as a PE-CVD layer, wherein the advantage of its use consists in that it has a barrier effect against corrosive media, wherein especially due to a fraction of carbon, a greater flexibility and toughness of the layer can be adjusted than for fully ceramic $SiO_2$ layers.

Finally, a silicon-organic lacquer layer based on a sol-gel layer, in particular with a preferred layer thickness in the range of 0.5 µm to 5 µm, can be applied onto the optical multi-layer system 3 as covering layer 7.

In order to achieve a reduced loss of the total light reflectivity over long-term use of the inventive composite material and/or use at elevated temperature, that is, in order to retard the ageing process, the intermediate layer 2 according to the invention includes the organic, layer-forming lacquer, or is formed entirely from one such lacquer, when no additional partial layer 8b is present in the intermediate layer 2. The organic lacquer, preferably a cyclo-aliphatic or cyclo-aromatic ether, in particular an epoxy lacquer, is hardened preferably by a cationic photo-polymerization and crosslinking, wherein the reaction proceeds according to the following mechanism:

1. Acid formation under UV radiation cationic photo-initiator+"acid anion"→acid+residue
2. Chain start reaction epoxy monomer+acid→"epoxy monomer-cation"+"acid anion"
3. Polymerization "epoxy monomer-cation"+epoxy monomer+epoxy monomer . . . →polymer As has been mentioned, sulfonium or iodonium salts can be used as photo-initiators here.

A UV-hardening cyclo-aliphatic epoxy lacquer which forms a 100% system (1-K system) with the photo-initiator and which post-crosslinks after the UV exposure at room temperature, appears to be particularly suitable. Mercury medium-pressure emitters with a power output in the range of 150 to 250 W/cm were used for irradiation of this kind of lacquer, wherein the applied UVA-dosage was in the range of 500 to 1000 $mJ/cm^2$. Using the resulting layer thickness D8a of the lacquer layer 8a in the range of maximum 1 µm to a maximum 15 µm, the intermediate product 1/2 formed from substrate 1 and intermediate layer 2, after the initial UV-hardening, could be rolled up into a coil without crack formation and/or delamination, and the post-crosslinking was carried out in this condition. The maximum, final hardness appeared after one week.

The confectioning of the intermediate product 1/2 to the final composite material V, that is, the application of the optically active multi-layer optical system 3, took place during this time period after post-hardening by means of a PVD-coating, or specifically within 24 hours after the application of the lacquer and irradiation, so that a good adhesion strength between the intermediate layer 2 and the optically active multi-layer system 3 could be obtained. The reflection layer 6 was bonded to the intermediate layer 2 here by means of an adhesion-promoting layer 9.

The adhesion-promoting layer 9 is provided so as to additionally increase the adhesion of the reflective layer 6 consisting of silver, onto the intermediate layer 2. Suitable layer materials herein are in particular, oxidic adhesion promoting agents, such as preferably $Al_2O_3$, $TiO_2$ or $CrO_s$, wherein s denotes a stoichiometric or non-stoichiometric ratio and should be in the range of $0 \leq s \leq 1.5$. The layer thickness D9 of the adhesion-promoting layer herein can be in the range of 0.1 nm to 50 nm, preferably in the range of 0.5 nm to 25 nm. A range of between 10 nm to 20 nm is viewed as being particularly preferred.

To improve the adhesion to and prevent any delamination of the lower refractive layer 5 from the silver layer 6, an additional adhesion-promoting layer 10 can be provided; as illustrated; which is likewise in particular oxidic and can consist of $CrO_s$. The second adhesion-promoting layer 10, which is associated with the optical multi-layer system 3 due to its position, can have a thickness D10 here which resides in the same range as that of the first adhesion-promoting layer 9. A light-absorptive effect is known for the chrome-oxidic, in particular the sub-stoichiometric $CrO_s$-compounds compared to tri-valent chromium. However, this effect reduces the high, total light reflectivity only marginally, especially when thickness D10 of the second adhesion-promoting layer 10 is in a preferred range of 0.5 nm to 10 nm.

The adhesion-promoting layers 9, 10; like the layers 4, 5, 6 of the optical multi-layer system; can be sputter layers, in particular layers produced by reactive sputtering, CVD or PE-CVD layers or layers produced by vapor coating, especially by electron bombardment or generated from thermal sources, so that the entire multi-layer optical system present on the intermediate layer 2 consists of layers applied in a vacuum sequence, in particular in a continuous process.

All layers and/or partial layers of the invented composite material V, as well as the good adhesion between them contribute to a high scratch resistance. In particular, in a synergistic cooperation, both the comparatively thicker and harder lacquer layer 8a; if used; the anodized layer 8b, and also the comparatively thinner and less hard dielectric layers located thereon, all make a contribution.

The improvement in properties attainable according to the invention is expressed in particular in that the following stress tests were passed:

1008 h QUV-B-stress (8 h irradiation at 70° C./313 nm/0.48 W/m²; 4 h condensation at 50° C.)
72 h UV-A/B stress at 150° C.,
1008 h temperature stress at 80° C.
72 h UV-A/B temperature stress at 150° C.,
72 h UV-A/B temperature stress at 200° C.,
72 h UV-A/B temperature stress at 250° C., The criterion used to determine whether a test was passed, was in each case that the composite material V displayed no black spots, no cloudiness, and no delamination when peeled off with an adhesive tape (e.g. Scotch tape 600).

The person skilled in the art can supplement the invention through additional favorable measures, without leaving the scope of the invention. For example; as is likewise indicated in the illustration; an additional decorative layer 12 can be applied onto the side B facing away from the optical multi-layer system 3, in particular on the substrate 1, which can also optionally have an anodic oxidic layer 11 on this side. This decorative layer 12 can be, for example, a metallic reflective layer or one made of titanium nitride or other suitable materials, which can lend the layer a sheen and also a certain coloration. This is an advantage in particular when reflector elements for lighting are to be produced from the composite material V according to the invention.

Another preferred application is the placement of LED lighting sources, e.g. in the form of chips, onto the surface of the invented composite material V. With regard to the additional possible details, the reader is referred to the document DE 10 2012 108 719 A1 in its entirety, for example.

Finally, owing to its long-term stability and high total light reflection, the composite material V according to the invention has outstanding suitability for use in solar facilities which are installed in greenhouses and concentrate sunlight into heat energy, as is described in U.S. Pat. No. 8,915,244 B2, for example. Here too, the reader is referred to the referenced document in its entirety for a description of additional possible details.

Not only can a pair of upper dielectric and/or oxidic layers 4, 5 be disposed in the optical multi-layer system 3 over the reflective layer 6, but rather also several such pairs can be arranged so that the reflectivity of the invented composite material V can be even further enhanced. The optionally provided adhesion-promoting layer 10 can in this case be preferably a constituent on one such layer pair, wherein a layer located above it should display a correspondingly greater refractive index.

The invention also pertains to an anionic photo-polymerization, by which in particular methacrylates and acrylates can be converted into an organic lacquer suitable for the formation of the intermediate layer.

Now where Standards (DIN, ASTM etc.) are named in this present application, these each pertain to the version of the Standard applicable at the time of the application.

While the above description constitutes the preferred embodiment of the present invention, it will be appreciated that the invention is susceptible to modification, variation and change without departing from the proper scope and fair meaning of the accompanying claims.

What is claimed is:

1. A reflective composite material comprising, an aluminum substrate, with an intermediate layer made of a lacquer located on one side on the substrate, and an optically active multi-layer system applied above the intermediate layer; the multi-layer system includes at least three layers, wherein two upper layers comprise upper and lower dielectric or oxidic layers and a bottom layer is a metallic layer consisting essentially of silver, which forms a reflective layer, the intermediate layer includes an organic, layer-forming, silane-free, lacquer, which is hardened by ionic polymerization initiated by photo-chemical excitation and crosslinking, such that no monomers remain in the intermediate layer, wherein the upper dielectric or oxidic layer of the multi-layer optical system is a higher refractive layer than the lower dielectric or oxidic layer of the multi-layer optical system, wherein the upper dielectric or oxidic layer consists essentially of at least one of $Ta_2O_5$, $Nb_2O_5$, $MoO_3$, $TiO_2$ and $ZrO_2$, and the lower dielectric or oxidic layer consists essentially of at least one of $Al_2O_3$ and $SiO_2$, wherein the intermediate layer is formed from several partial layers, of which an upper partial layer consists essentially of the organic lacquer having a thickness in the range of 0.3 micrometers (μm) and 1.0 μm, and a lower partial layer consists essentially of anodic oxidized aluminum of the substrate, the lower partial layer having a thickness in the range of 0.010 μm to 10.0 μm, the upper partial layer penetrating into pores within the lower partial layer, wherein the reflective layer is bonded to the intermediate layer by an adhesion-promoting layer, the adhesion-promoting layer being an oxidic layer formed from at least one of $Al_2O_3$, $TiO_2$ and $CrO_s$ having a thickness in the range from 0.1 nm to 50 nm, wherein s denotes a stoichiometric or non-stoichiometric ratio and is in the range of 0<s<1.5.

2. The reflective composite material according to claim 1, wherein the ionic polymerization and crosslinking of the organic lacquer of the intermediate layer is accomplished by cationic photo-polymerization under an effect of UV-radiation.

3. The reflective composite material according to claim 1 further comprising, the organic lacquer of the intermediate layer is formed from a solvent-free or a solvent-containing single-component system, or a single-component acrylate system with an alcohol solvent.

4. The reflective composite material according to claim 1 further comprising, the organic lacquer of the intermediate layer is one or more of a cyclo-aliphatic, an aromatic ether, or an epoxy lacquer which contains a photo-initiator.

5. The reflective composite material according to claim 4 further comprising, the photo-initiator is one or more of a sulfonium salt, an iodonium salt, a diaryl iodonium salt, a diaryl iodonium salt with an added sensitizer, or a diaryl iodonium salt with a sensitizer in the form of a thioxanthone derivate.

6. The reflective composite material according to claim 1 further comprising, the organic lacquer of the intermediate layer features a degassing rate after hardening of less than $10^{-4}$ mbar|s|m$^2$.

7. The reflective composite material according to claim 1 further comprising, an additional adhesion-promoting layer arranged between the reflective layer and the lower dielectric or -oxidic layer of the multi-layer optical system.

8. The reflective composite material according to claim 1 further comprising, the thickness of the reflective layer is in the range from 30 nm to 200 nm.

9. The reflective composite material according to claim 1 further comprising, a silicon oxidic covering layer, a silicon nitridic covering layer, a silicon oxide-nitride covering layer, or a mixed covering layer having the chemical composition $Si_aC_bO_cN_dH_e$ with the indices a, b, c, d, and e denoting a stoichiometric or non-stoichiometric ratio applied onto the multi-layer optical system.

10. The reflective composite material according to claim 9, wherein the covering layer is the mixed layer having a chemical composition of $Si_aC_bO_cN_dH_e$, wherein the indices a, b, c, d and e are adjusted such that for a selected layer thickness, the covering layer has a light absorption of less than 10 percent, and wherein the carbon content; relative to the total mass of the covering layer; is in the range of 0.2 atom-percent to 15.0 atom-percent.

11. The reflective composite material according to claim 1, further comprising, a covering layer applied onto the multi-layer optical system, the covering layer being an organic silicon lacquer layer based on a sol-gel layer, with a thickness in the range from 0.5 μm to 5 μm.

12. The reflective composite material according to claim 1 wherein the upper and lower dielectric or oxidic layers of the multi-layer optical system each have a thickness in the range from 30 nm to 200 nm.

13. The reflective composite material according to claim 1 wherein the upper and lower dielectric or oxidic layers of the multi-layer optical system each have a thickness which amounts to one-quarter of an average wavelength for a spectral range of electromagnetic radiation to be reflected by the reflective composite material.

14. The reflective composite material according to claim 1 further comprising, a surface of the intermediate layer upon which the optically active multi-layer system is applied has an arithmetic mean roughness in the range of less than 0.02 μm.

15. The reflective composite material according to claim 1 further comprising, the aluminum of the substrate has a greater purity than 97%.

16. The reflective composite material according to claim 1 further comprising, the reflective composite material is formed as a coil with a width up to 1600 mm, and with a thickness of about 0.1 to 1.5 mm.

17. The reflective composite material according to claim 1 further comprising, a total light reflectivity on a side of the multi-layer optical system determined according to DIN 5036, part 3, is greater than 97%.

18. A method for production of a reflective composite material, wherein an intermediate layer made of a lacquer with a multi-layer optical system located thereon is applied to one side of an aluminum substrate, such that the multi-layer optical system is applied above the intermediate layer and includes at least three layers, wherein two upper layers are upper and lower dielectric or oxidic layers, and a bottom layer is a metallic layer consisting essentially of silver, which forms a reflective layer, wherein the intermediate layer is formed from several partial layers, of which an upper partial layer of the intermediate layer is formed by application of an organic, layer-forming, silane-free lacquer to a lower partial layer, wherein after the application, the organic, layer-forming, silane-free lacquer is hardened by ionic polymerization initiated by photo-chemical excitation and crosslinking, such that no monomers remain in the intermediate layer, the upper partial layer consisting essentially of the organic, silane-free lacquer having a thickness in the range of 0.3 micrometers (μm) and 1.0 μm and penetrating into pores within the lower partial layer, and the lower partial layer consisting essentially of anodic oxidized aluminum of the substrate and having a thickness in the range of 0.010 μm to 10.0 μm;

wherein the upper dielectric or oxidic layer of the multi-layer optical system is a higher refractive layer than the lower dielectric or oxidic layer of the multi-layer optical system, wherein the upper dielectric or oxidic layer consists essentially of at least one of $Ta_2O_5$, $Nb_2O_5$, $MoO_3$, $TiO_2$ and $ZrO_2$, and the lower dielectric or oxidic layer consists essentially of at least one of $Al_2O_3$ and $SiO_2$;

wherein the reflective layer is bonded to the intermediate layer by an adhesion-promoting layer, the adhesion-promoting layer being an oxidic layer formed from at least one of $A_2O_3$, $TiO_2$ and $CrO_s$ having a thickness in the range from 0.1 nm to 50 nm, wherein s denotes a stoichiometric or non-stoichiometric ratio and is in the range of 0<s<1.5.

19. The method according to claim 18, wherein the ionic photo-polymerization is a cationic photo-polymerization, which takes place through the use of an iodonium or sulfonium salt as photo-initiator, from a monomer which contains epoxy groups.

20. The method according to claim 18 further comprising, in that one or a plurality of the two upper layers or the bottom layer arranged over the intermediate layer is applied onto the intermediate layer by sputtering, by CVD or PE-CVD methods, or by vapor-coating.

21. The method according to claim 18 further comprising, in that at least two of the layers arranged over the intermediate layer are applied in a continuous process in a vacuum.

22. The method according to claim 18 further comprising, in that the lacquer is applied by immersion, by electro-immersion lacquering, by brushing on, by rolling on, by centrifuging, by spraying, or in a continuous belt cycle method.

23. The method according to claim 18 further comprising, in that the lacquer is hardened by the use of at least one of UV, IR, electron and laser radiation, at least until a hand-tack is attained, which is indicated by the appearance of a no-longer tacky surface of the intermediate layer, in a time period of 100 seconds to 300 seconds.

24. The method according to claim 23 further comprising, in that the lacquer contains an acrylate and is exposed to UV radiation at an energy dosage in the range of 1 $J/cm^2$ to 3 $J/cm^2$ by use of mercury medium-pressure lamps, for formation and hardening of a film.

25. The method according to claim 23 further comprising, in that until its final strength is attained, the lacquer is hardened over a period of time of 25 hours to 150 hours.

26. The method according to claim 25 further comprising, in that coating of the intermediate layer with the optically active multi-layer optical system takes place during hardening of the lacquer.

* * * * *